(12) United States Patent
Lee et al.

(10) Patent No.: US 9,466,403 B2
(45) Date of Patent: Oct. 11, 2016

(54) METHOD FOR PRODUCING A FLEXIBLE TRANSPARENT ELECTRODE USING CESIUM AND A FLEXIBLE TRANSPARENT ELECTRODE PRODUCED THEREBY

(71) Applicant: Research & Business Foundation SUNGKYUNKWAN UNIVERSITY, Suwon-si (KR)

(72) Inventors: Hoojeong Lee, Suwon-si (KR); Sunho Kim, Siheung-si (KR); Sekwon Na, Seoul (KR); Jun Gu Kang, Seoul (KR)

(73) Assignee: Research & Business Foundation SUNGYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/497,955

(22) Filed: Sep. 26, 2014

(65) Prior Publication Data

US 2015/0090479 A1 Apr. 2, 2015

(30) Foreign Application Priority Data

Sep. 27, 2013 (KR) .......................... 10-2013-0115192

(51) Int. Cl.
| | | |
|---|---|---|
| *H01B 5/14* | (2006.01) | |
| *H05K 1/02* | (2006.01) | |
| *H05K 1/09* | (2006.01) | |
| *B23K 31/00* | (2006.01) | |
| *H01B 1/02* | (2006.01) | |
| *H01L 51/44* | (2006.01) | |
| *H01B 1/16* | (2006.01) | |
| *H01L 31/18* | (2006.01) | |

(52) U.S. Cl.
CPC *H01B 1/02* (2013.01); *H01B 1/16* (2013.01); *H01L 31/1884* (2013.01); *H01L 51/442* (2013.01); *H05K 1/097* (2013.01); *H05K 2201/026* (2013.01); *Y02E 10/549* (2013.01)

(58) Field of Classification Search
CPC ....... H01B 1/02; H01B 1/16; H01L 31/1884; H01L 51/442; H01L 31/022466; H05K 2201/026
USPC .......................................... 228/180.5; 156/280
See application file for complete search history.

(56) References Cited

U.S. PATENT DOCUMENTS

| | | | |
|---|---|---|---|
| 2010/0183919 A1* | 7/2010 | Holme .................. | B82Y 10/00 429/209 |
| 2014/0048131 A1* | 2/2014 | Tanaka .................... | H01B 1/22 136/256 |

* cited by examiner

*Primary Examiner* — Erin Saad
(74) *Attorney, Agent, or Firm* — NSIP Law

(57) ABSTRACT

An method for preparing a flexible transparent electrode film that has a high transmittance and low sheet resistance without having to go through a separate heating process by using cesium, and a flexible transparent electrode film prepared thereby, the method including: applying a nanowire transparent conductive film on a high molecular base material film; coating the nanowire transparent conductive film with a sol-gel solution wherein titanium dioxide and cesium are mixed; and welding the nanowire.

6 Claims, 5 Drawing Sheets

(a)

(b)

METHOD FOR PRODUCING A FLEXIBLE TRANSPARENT ELECTRODE USING CESIUM AND A FLEXIBLE TRANSPARENT ELECTRODE PRODUCED THEREBY

CROSS-REFERENCE TO RELATED APPLICATION

This application claims the benefit of priority under 35 U.S.C. §119(a) of Korean Patent Application No. 10-2013-0115192, filed on Sep. 27, 2013, in the Korean Intellectual Property Office, the entire disclosure of which is incorporated herein by reference for all purposes.

FIELD

Various embodiments of the present invention relate to a method for preparing a flexible transparent electrode film using cesium and a flexible transparent electrode film produced thereby, and more particularly to a method for producing a flexible transparent electrode film using a sol-gel solution of titanium dioxide and cesium and thus does not require a thermal treatment, and a flexible transparent electrode film produced thereby.

BACKGROUND

As the demand for portable flexible displays and large size flexible displays increases, display materials that can be folded or rolled are needed. For this purpose, an electrode material for display use should be transparent (transmittance of 80% or more), have a low resistance (sheet resistance), and have a high strength so that it is mechanically stable even when bent or folded, and have a thermal expansion coefficient that is similar to a plastic substrate, so that even when a device using the display is overheated or placed under a high temperature, it is not disconnected and its sheet resistance does not change significantly.

However, in the case of a flexible display, in order to realize flexibility, low price, and lightweightness, conventional glass substrates need to be substituted to transparent and flexible plastic substrates. Plastic substrates have an extremely low thermal resistance temperature, and a transparent substrate having a thermal resistance of 150° C. to 200° C. has been developed. Accordingly, when forming a transparent electrode by sputtering an ITO electrode on a plastic substrate, reducing the specific resistance of the film may be restricted, due to difficulty in heating.

Not only that, ITO has a lower coefficient of expansion compared to a high molecular compound, and thus due to a long thermal history when producing or driving a device, the substrate and electrode thermal expands in different ratios, causing deformation of the substrate. Furthermore, a conventional ITO electrode is mechanically weak, and breaks easily causing a problem of increased sheet resistance of the electrode as the electrode substrate for use in a flexible display bends.

Furthermore, in the case of producing a transparent electrode film using a nanowire that is being studied in various methods, it is important for a transparent electrode to have a high transmittance and high electroconductivity at the same time. These two factors are inversely proportionate to each other, and thus when producing a film with only nanowire, the ratio of transmittance to electroconductivity deteriorates, and thus it is necessary to improve the electroconductivity without undermining the transmittance through thermal treatment.

However, thermal treatment cannot be applied to a flexible high molecular substrate that is weak to heat. In order to improve the electroconductivity through a thermal treatment on a nanowire film, at least 150° C. heat must be applied. But a flexible high molecular substrate would be deformed even under 100° C. of heat, and not only that, the deformation of the substrate deteriorates the electroconductivity of the film.

PRIOR ART DOCUMENTS

Patent Literature

1. Korean patent registration no. 10-1279586
2. Korean patent publication no. 10-2011-0052759
3. Korean patent publication no. 10-2011-0043374

SUMMARY

A purpose of the various embodiments of the present invention is to resolve the problem of a conventional flexible high molecular transparent film where transmittance and electroconductivity cannot be obtained at the same time, that is, to provide a method of improving the electroconductivity without undermining the transmittance by coating a nanowire layer with titanium dioxide including cesium.

Another purpose of the various embodiments of the present invention is to provide a flexible transparent electrode film with excellent sheet resistance, transmittance, and haze, by coating the flexible transparent electrode film with titanium dioxide including cesium.

According to an embodiment of the present invention, there is provided a method for producing a flexible transparent electrode film using cesium, the method including applying a nanowire transparent conductive film on a high molecular base material film; coating the nanowire transparent conductive film with a sol-gel solution wherein titanium dioxide and cesium are mixed; and welding the nanowire.

0.1 to 1 parts by weight of cesium may be used per 100 parts by weight of sol-gel solution.

The applying, coating, and welding may be performed at room temperature.

The coating may be bar-coating, spin-coating, casting, or dip-coating process, or a combination thereof.

An alcohol solvent may be used in the bar-coating.

The high molecular base material film may include a high-molecular compound of polyethyleneterephtalate (PET), polyethylenenaphtalate (PEN), polyethylene (PE), polyetherfone (PES), polycarbonate (PC), polyarylate (PAR), or polyimide (PI), or a combination thereof.

According to another embodiment of the present invention, there is provided a flexible transparent electrode film using cesium produced by the aforementioned method.

The flexible transparent electrode film may have a transmittance of 95% to 99%.

The flexible transparent electrode film may have a sheet resistance of 150 Ω/sq to 800 Ω/sq.

According to another embodiment of the present invention, there is provided a flexible transparent electrode film including a high molecular substrate; nanowire applied on the high molecular substrate; and titanium dioxide and cesium coated on the nanowire.

According to the aforementioned embodiments of the present invention, by using a sol-gel solution where cesium and carbon dioxide are mixed therein, it is possible to weld a nanowire without having to go through a thermal treatment process.

Furthermore, as the nanowire is welded, the transparent electrode film may have an excellent electroconductivity.

Furthermore, as a thermal treatment process is not performed, the flexible transparent electrode film may have excellent transmittance and transparency of the substrate, and economically feasible and stable.

The aforementioned effects of the various embodiments of the present invention are not limited to the aforementioned effects, but other effects not mentioned herein may also be clearly understood by those skilled in the art based on the claims.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

As illustrated in the flowchart of FIG. 1, a method for producing a flexible transparent electrode film according to an embodiment of the present invention includes applying (S10), coating (S20), and dispersing (S30).

The applying (S10) is a step of applying a nanowire transparent conductive film on a high molecular base material film. It is a step of providing electroconductivity so that the high molecular base material film may be used as an electrode, and of maintaining the transmittance.

Any transparent high molecular material may be used as a high molecular film in an embodiment of the present invention, but desirably it may be a high molecular compound including a high-molecular compound of polyethyleneterephtalate (PET), polyethylenenaphtalate (PEN), polyethylene (PE), polyetherfone (PES), polycarbonate (PC), polyarylate (PAR), or polyimide (PI), or a combination thereof.

That is because PET may still have excellent optical, electrical, and mechanical characteristics, and also maintain the thermal resistance function even when produced from a broad and thin film of 0.25 mm or less.

Any nanowire may be used in the nanowire transparent conductive film according to an embodiment of the present invention as long as it has electroconductivity, but it may be desirably a metal nanowire, and more desirably a silver (Ag) nanowire.

Silver (Ag) is a metal having the highest electroconductivity. It has a resistance of 80 to 120Ω, which is lower than the resistance of ITO, which is 200 to 400Ω, and thus silver (Ag) is favorable in producing a large nanowire. Not only that, silver (Ag) may be produced in a curve shape, and thus be applied to a flexible display. Furthermore, silver (Ag) nanowire is almost colorless, and thus may not distort a display image.

Any applying method well known in the related field may be used to apply a nanowire transparent conductive film on a high molecular base material film according to an embodiment of the present invention, but desirably the bar-coating method. That is because, a nanowire transparent conductive film may be applied in a simple process without any additional equipment, and because a continuous operation is possible through roll-to-roll coating in the case of applying the nanowire transparent conductive film on a large substrate or flexible substrate, thereby not only reducing the manufacturing costs of the substrate, but also enabling an even application.

The coating (S20) is a step of coating a nanowire transparent conductive film with a sol-gel solution where titanium dioxide and cesium are mixed therein. It is a step where the nanowire and the mixed solution of titanium dioxide and cesium mixed solution reacts to each other.

Any coating method may be used, but desirably bar-coating, spin-coating, casting, or dip-coating, and more desirably bar-coating.

That is because, not only is bar-coating a simple process just like the applying (S10), but it may also be performed continuously, thereby enabling an even application.

Furthermore, any solvent may be used in the bar-coating, but desirably an organic solvent, and more desirably alcohol.

The sol-gel solution where titanium dioxide and cesium are mixed therein is a precursor of cesium. It is a solution where cesium carbonate ($Cs_2CO_3$) and titanium dioxide are dissolved in the form of sol-gel, wherein the cesium carbonate is the only metal that may be dissolved in alcohol used as the bar-coating solvent.

Furthermore, cesium is a 1 family alkali metal having advantages of low cost, excellent economic feasibility, and high reactivity.

Herein, per 100 parts by weight of sol-gel solution, 0.1 to 1 parts by weight of cesium may be used.

That is because, when cesium is less than 0.1 parts by weight, a nanowire may not be welded, and when cesium exceeds 1.0 parts by weight, the transmittance deteriorates.

The welding (S30) is a step where the nanowire, titanium dioxide, and cesium used in the applying (S10) and coating (S20) react to each other.

When a substrate where the nanowire is applied is coated with the sol-gel solution including titanium dioxide and cesium, the nanowire is welded and connected as illustrated in the photograph of FIG. 2(b), which provides the same effects as a conventional fused nanowire after the nanowire is thermal treated at a high temperature.

That is, it is important for a transparent electrode film to have both transmittance and electroconductivity, but these two factors are inversely proportionate to each other. A conventional film produced by a nanowire had poor ratio of transmittance to electroconductivity, and thus a thermal treatment had to be performed to improve the electroconductivity without undermining the transmittance.

However, a thermal treatment may not be applied to a flexible high molecular substrate that is weak to heat, and in order to improve the electroconductivity through a thermal treatment, at least 150° C. of heat must be applied, but a flexible high molecular substrate may be deformed even under heat of 100° C. or above, thereby deteriorating the electroconductivity.

On the other hand, using cesium according to an embodiment of the present invention, it is possible to use a flexible high molecular substrate that is weak to heat as a nanowire transparent electrode film by a simple method without a thermal treatment at a high temperature.

That is, when using a sol-gel solution including titanium dioxide and cesium according to an embodiment of the present invention, an additional conventional thermal heating process is unnecessary, thereby increasing economic feasibility and safety of the producing process since there is no high temperature process.

Therefore, the applying (S10), coating (S20), and welding (S30) that form the method for producing a flexible transparent electrode film using cesium of the present invention may all be performed at room temperature.

A flexible transparent electrode film may be produced using a method for producing a flexible transparent electrode film using cesium according to an embodiment of the present invention.

Herein, the transparent electrode film produced according to an embodiment of the present invention may have a transmittance of 95% to 99%, and desirably 96% to 98.5%.

To be used as the transparent electrode film in the present invention, its transmittance in a visible ray area of 380 nm to 780 nm should be 80% or above, and by using cesium according to an embodiment of the present invention, a nanowire is welded, thereby providing a high transmittance.

A transparent electrode film produced according to an embodiment of the present invention may have a sheet resistance of 150 Ω/sq to 800 Ω/sq, desirably 180 Ω/sq to 670 Ω/sq. That is because, only when the sheet resistance is 1000 Ω/sq or less, the transparent electrode film has excellent electroconductivity.

EXAMPLES

Hereinafter, embodiments of the present invention will be explained in further detail, but they should not be construed as limited thereto.

Embodiment 1

A PET substrate was bar-coated with an applying solution of which silver (Ag) nanowire was 1.4 weight % of the total coating solution to form a transparent electroconductive film of 0.1 μM, and then a bar-coating was proceeded at 10 mm/sec on the transparent electroconductive film having a coating solution of cesium-titanium dioxide and ethanol wherein cesium is 0.2 weight % to produce a transparent electrode film.

Embodiment 2

A coating solution having cesium-titanium dioxide and ethanol wherein cesium is 0.6 weight % was used as a coating solution, and a bar-coating was performed under the same conditions as in embodiment 1.

Embodiment 3

An applying solution having silver nanowire of 1.7 weight % was used, and a bar-coating was performed under the same conditions as in embodiment 1.

Embodiment 4

An applying solution having silver nanowire of 1.7 weight % was used, and a coating solution of cesium-titanium dioxide and ethanol of which cesium was 0.6 weight % was used, and a bar-coating was performed under the same conditions as in embodiment 1.

Comparative Embodiment 1

A PET substrate was bar-coated with an applying solution of which silver (Ag) nanowire was 1.4 weight % of the total coating solution to form a transparent electroconductive film of 0.1 μm.

Comparative Embodiment 2

A PET substrate was bar-coated with an applying solution of which silver (Ag) nanowire was 1.7 weight % of the total coating solution, and a transparent electrode film was produced under the same conditions as in comparative embodiment 1.

Hereinafter, [Table 1] shows the sheet resistance (Ω/sq) and transmittance (%) of the aforementioned embodiments and comparative embodiments.

TABLE 1

|  | Sheet resistance (Ω/sq) | Transmittance (%) |  | Sheet resistance (Ω/sq) | Transmittance (%) |
| --- | --- | --- | --- | --- | --- |
| Comparative embodiment 1 | 28440 | 96.16 | Comparative embodiment 2 | 3754.25 | 95.78 |
| Embodiment 1 | 1360 | 96.87 | Embodiment 3 | 665 | 96.31 |
| Embodiment 2 | 459 | 96.38 | Embodiment 4 | 338 | 95.93 |

The sheet resistances of comparative embodiment 1, embodiment 1, and embodiment 2 having a same silver nanowire weight % were measured. As a result, the sheet resistance of comparative embodiment 1 that was not coated was about 60 to 200 times higher than embodiments 1 and 2.

Furthermore, the sheet resistances of comparative embodiment 2, embodiment 3, and embodiment 4 having a same silver nanowire weight % of 1.7 weight % were measured. As a result, the sheet resistance of comparative embodiment 2 that was not coated with a mixed solution of titanium dioxide and cesium was about 5 to 10 times higher than embodiments 3 and 4.

The transmittance of embodiments 1 to 4 were all 95% or above. This is a resolution to the problem of prior art where decreased sheet resistance decreased the transmittance. A transparent electrode film produced by embodiments of the present invention have a low sheet resistance and a high transmittance at the same time.

Figure 1:
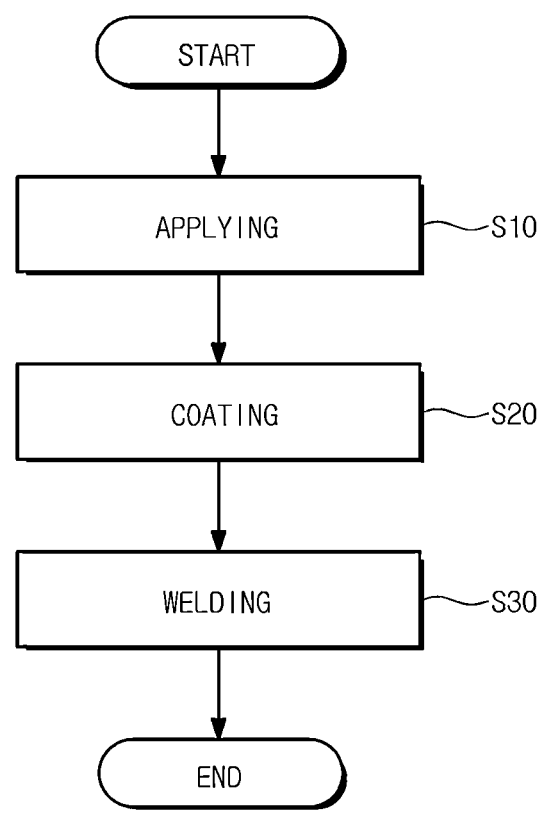
FIG. 1 is a diagram illustrating an order of a method for producing a flexible transparent electrode film using cesium according to an embodiment of the present invention.
Figure 2:
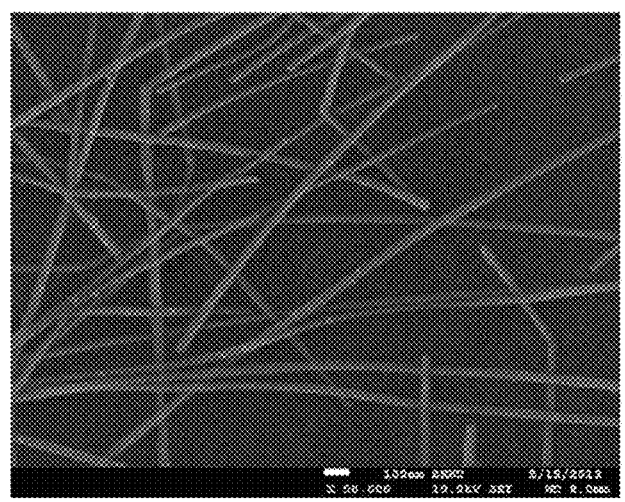
FIG. 2 is an SEM photograph of before and after a coating according to an embodiment of the present invention.
Figure 2:
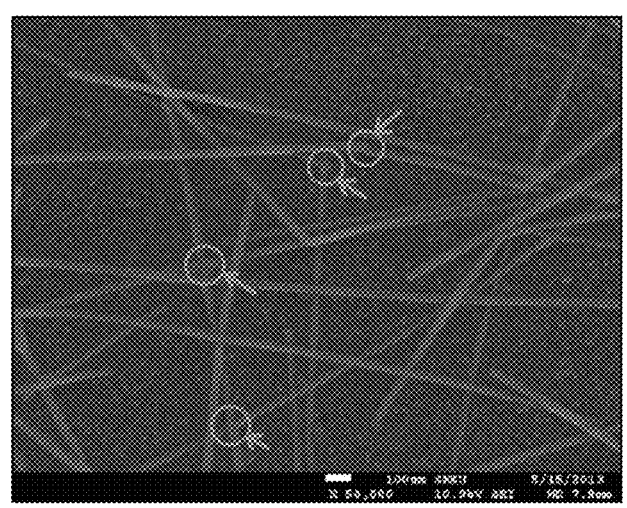
Figure 3:
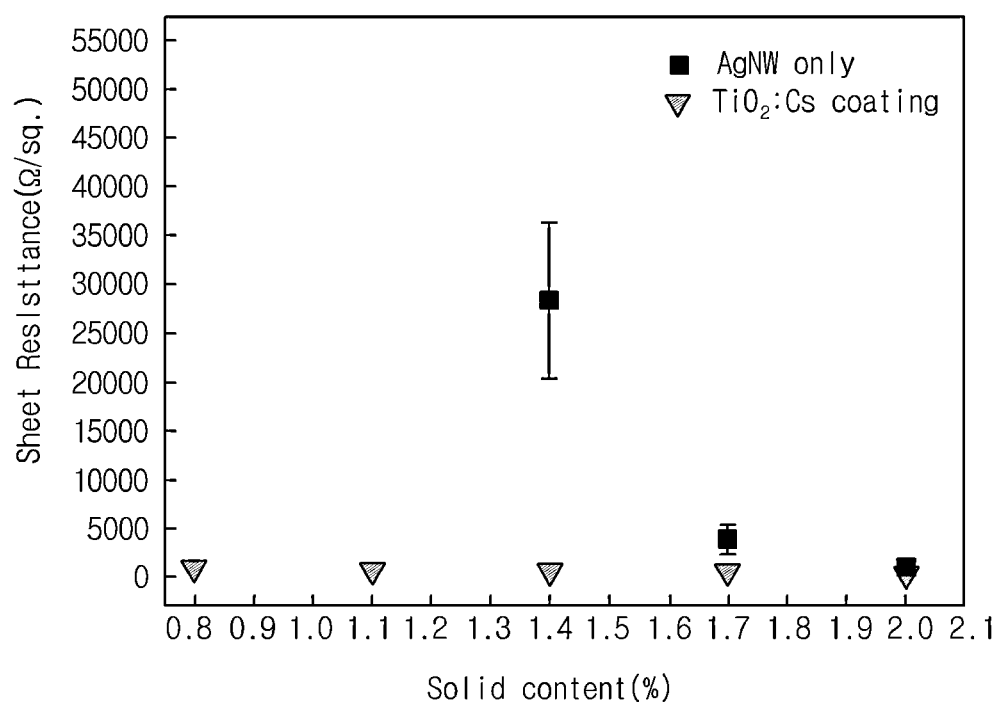
FIG. 3 is a graph illustrating sheet resistances of before and after a coating according to an embodiment of the present invention.
Figure 4:
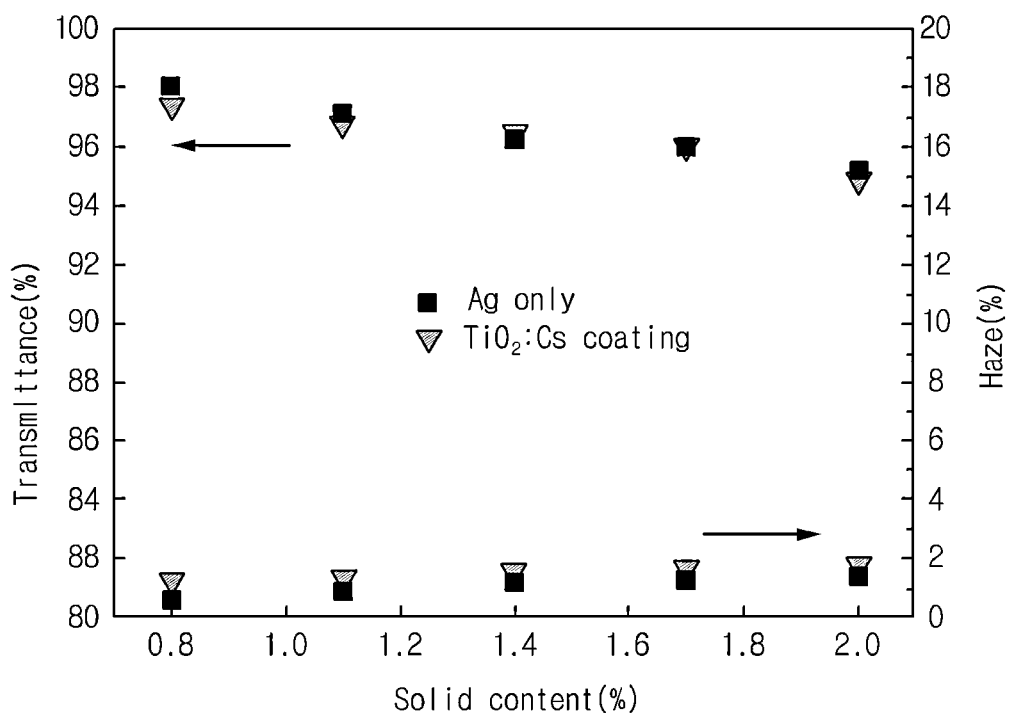
FIG. 4 is a graph illustrating a transmittance and haze of before and after a coating according to an embodiment of the present invention.
Figure 5:
FIG. 5 is a photograph illustrating a flexible transparent electrode film produced according to an embodiment of the present invention.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A method for preparing a flexible transparent electrode film using cesium, the method comprising:

applying a nanowire transparent conductive film on a base film;

coating the nanowire transparent conductive film with a sol-gel solution wherein titanium dioxide and cesium are mixed; and welding between nanowires in the nanowire transparent conductive film.

2. The method according to claim 1, wherein 0.1 to 1 parts by weight of cesium is used per 100 parts by weight of sol-gel solution.

3. The method according to claim 1, wherein the applying, coating, and welding are performed at room temperature.

4. The method according to claim 1, wherein the coating is bar-coating, spin-coating, casting, or dip-coating process, or a combination thereof.

5. The method according to claim 4, wherein an alcohol solvent is used in the bar-coating.

6. The method according to claim 1, wherein the base film comprises a high-molecular compound of polyethyleneterephtalate (PET), polyethylenenaphtalate (PEN), polyethylene (PE), polyetherfone (PES), polycarbonate (PC), polyarylate (PAR), or polyimide (PI), or a combination thereof.

* * * * *